United States Patent
Mryasov et al.

(10) Patent No.: US 9,324,401 B2
(45) Date of Patent: Apr. 26, 2016

(54) MODULAR MAGNETORESISTIVE MEMORY

(75) Inventors: Oleg N. Mryasov, Bradford Woods, PA (US); Thomas F. Ambrose, Sewickley, PA (US); Werner Scholz, Pittsburgh, PA (US)

(73) Assignee: Seagate Technology, LLC, Cupertino, CA (US)

(*) Notice: Subject to any disclaimer, the term of this patent is extended or adjusted under 35 U.S.C. 154(b) by 0 days.

(21) Appl. No.: 12/881,072

(22) Filed: Sep. 13, 2010

(65) Prior Publication Data

US 2011/0007558 A1    Jan. 13, 2011

Related U.S. Application Data

(63) Continuation of application No. 11/969,248, filed on Jan. 4, 2008, now Pat. No. 7,795,696.

(51) Int. Cl.
*H01L 29/82* (2006.01)
*G11C 11/16* (2006.01)

(52) U.S. Cl.
CPC ...................... *G11C 11/16* (2013.01)

(58) Field of Classification Search
CPC ..... H01L 43/08; H01L 29/82; H01L 23/5226; H01L 23/528; H01L 27/222; H01L 43/065; G11C 11/16
USPC ...................... 257/421–427, E29.323; 438/3; 360/324–326, 313; 365/157–158; 365/171–173; 29/737
See application file for complete search history.

(56) References Cited

U.S. PATENT DOCUMENTS

| | | | |
|---|---|---|---|
| 6,473,275 B1* | 10/2002 | Gill | 360/314 |
| 6,480,365 B1* | 11/2002 | Gill et al. | 360/324.11 |
| 7,190,611 B2 | 3/2007 | Nguyen et al. | |
| 7,221,584 B2 | 5/2007 | Liu et al. | |
| 2003/0214763 A1* | 11/2003 | Childress et al. | 360/324.2 |
| 2005/0106810 A1* | 5/2005 | Pakala et al. | 438/257 |
| 2006/0152973 A1 | 7/2006 | Lin et al. | |
| 2006/0175675 A1 | 8/2006 | Braun | |
| 2006/0176734 A1 | 8/2006 | Braun | |
| 2007/0035891 A1 | 2/2007 | Freitag et al. | |
| 2007/0097730 A1 | 5/2007 | Chen et al. | |
| 2007/0164380 A1 | 7/2007 | Min et al. | |
| 2007/0165449 A1 | 7/2007 | Zheng et al. | |
| 2007/0171694 A1 | 7/2007 | Huai et al. | |

OTHER PUBLICATIONS

Slonczewski in an article published in Phys. Rev. B, vol. 39(10), 6995, 1989.*
Ji et al., Physical Review Letters, vol. 90(10) 106601 Mar. 14, 2003.*
Sarau et al. J. Applied Physics, 102, (8) 083907 (2007).*

* cited by examiner

*Primary Examiner* — Jami M Valentine
(74) *Attorney, Agent, or Firm* — Hall Estill Attorneys at Law

(57) ABSTRACT

A magnetoresistive memory element is provided with a read module having a first pinned layer with a magnetoresistance that is readable by a read current received from an external circuit. A write module has a nanocontact that receives a write current from the external circuit and, in turn, imparts a spin torque to a free layer that functions as a shared storage layer for both the read module and the write module.

17 Claims, 10 Drawing Sheets

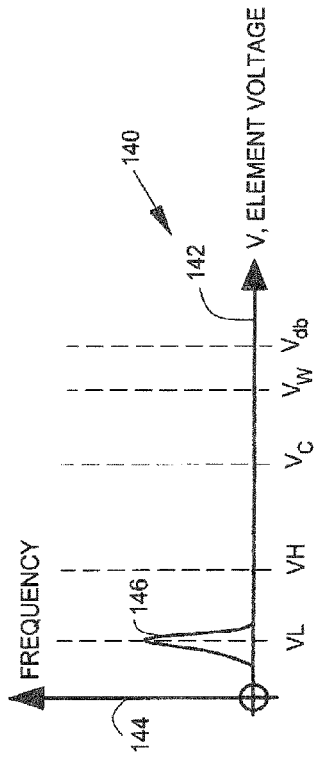
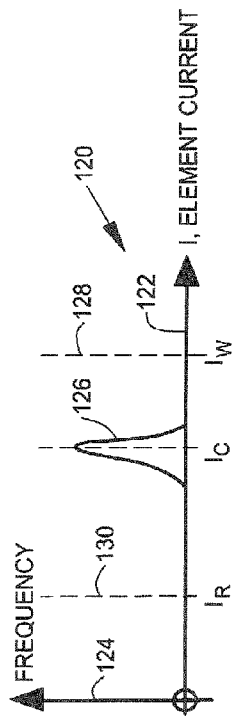
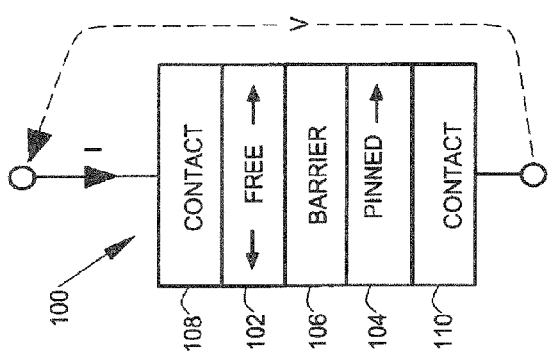
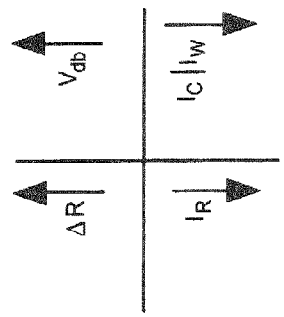

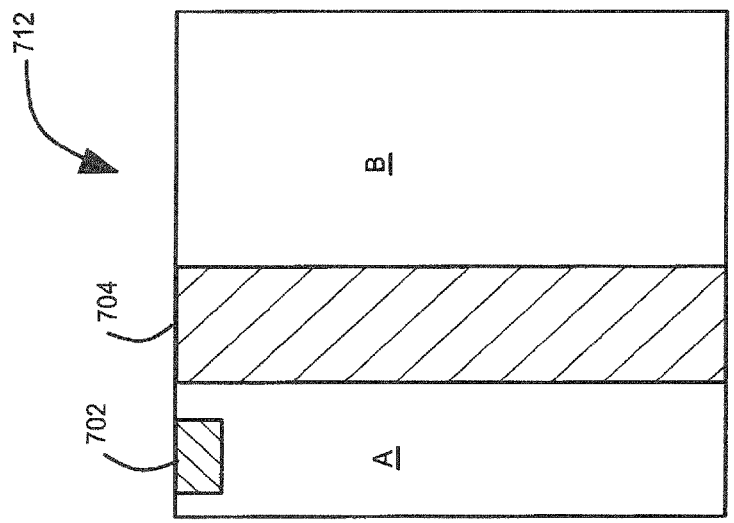
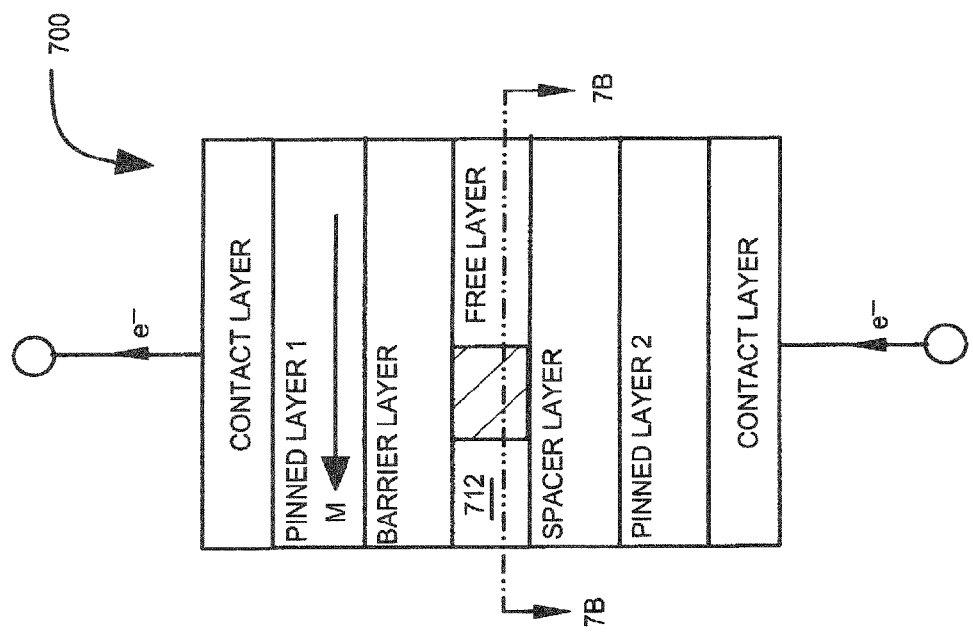
FIG. 7B
FIG. 7A

MODULAR MAGNETORESISTIVE MEMORY

CROSS-REFERENCE TO RELATED APPLICATION

This application is a continuation of, thereby claiming the benefit of the earlier filing date of, U.S. Ser. No. 11/969,248, now U.S. Pat No. 7,795,696.

BACKGROUND

Non-volatile solid state data storage is an advancing technology for future data storage applications. Solid state data storage devices are typically better suited than disc drives for applications that require small form factors, low power consumption, and robust mechanical shock resistance. Among various silicon-based solid state data storage technologies, flash memory is non-volatile and offers very high storage densities. However, flash memory performance is limited by its long write times (about 0.1-1 microsecond) and a limited number of data overwrites that can be successfully achieved. One non-volatile solid state technology vying to compete with flash memory is magnetic random access memory (MRAM). Unlike flash memory, MRAM has infinite write endurance and orders of magnitude faster write times (about 1-10 nanoseconds). MRAM has a potential to achieve similar areal density and cost as flash memory when the magnetic bits are written in an MRAM cell via spin torque instead of with externally applied magnetic fields. However, there are unsolved problems with design margins and process variations in spin torque MRAM cells that limit the ability to make large MRAM arrays.

Aspects of the present invention provide solutions to these and other problems, and offer other advantages over the prior art.

SUMMARY

In some embodiments a magnetoresistive memory element is provided with a read module having a first pinned layer with a magnetoresistance that is readable by a read current received from an external circuit. A write module has a nano-contact that receives a write current from the external circuit and, in turn, imparts a spin torque to a free layer that functions as a shared storage layer for both the read module and the write module.

BRIEF DESCRIPTION OF THE DRAWINGS

FIG. 1A illustrates a magnetoresistive tunneling element or magnetoresistive random access memory (MRAM) cell that is not modular.

FIG. 1B illustrates manufacturing process variations of the critical current level $I_C$ in an array of MRAM cells.

FIG. 1C illustrates a graph of MRAM cell voltage V.

FIG. 1D represents a design table that graphically illustrates design goals for an MRAM cell.

FIGS. 7A, 7B, 8A, 8B illustrates a modular magnetoresistive memory element with a free layer that includes patterning for storage of two bits of information.

DETAILED DESCRIPTION

Figure 2A:
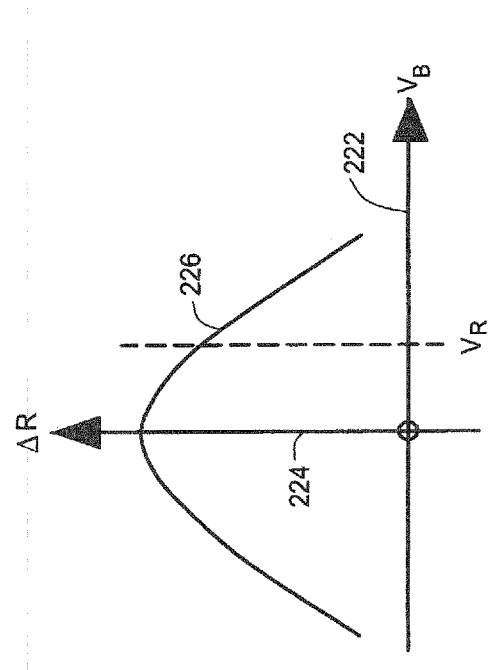
FIG. 2A illustrates a graph of normalized spin torque $\tau_w/I_W$ as a function of bias voltage $V_B$.

In FIGS. 3-11, modular magnetoresistive memory elements are disclosed. The magnetoresistive memory elements include a read module, a write module and a free layer between the read module and the write module. The free layer serves as a storage layer for storing one or more bits of information. The read module includes a first pinning layer that provides spin torque to the free layer. The write module also provides spin torque to the free layer. According to one aspect, the write module includes a second pinning layer that provides spin torque to the free layer. According to another aspect, the write module includes a nanocontact that provides spin torque to the free layer. The additional spin torque provided to the free layer decreases the amount of a critical current that is needed to switch the free layer and improves design margins for an array of magnetoresistive elements.

FIG. 1A illustrates a magnetoresistive tunneling element 100, also called a magnetoresistive random access memory (MRAM) cell 100. MRAM cell 100 comprises a free layer 102, a pinned layer 104 and a barrier layer 106 between the free layer 102 and the pinned layer 104. Electrical contact is made to the MRAM cell 100 by a top contact layer 108 and a bottom contact layer 110. The MRAM cell 100 is connected to an external electronic circuit (not illustrated in FIG. 1A) that provides an element current I to the MRAM element. The level of element current I is controlled by the external electronic circuit.

During a quiescent time interval, the element current I is substantially zero. During a write time interval, the element current I is at a write current level $I_W$. During a read time interval, the element current I is at a read current level $I_R$. The element current I, passing through the MRAM element 110, produces an element voltage V across the element 100. The MRAM cell 100 has a critical current level $I_C$ that, when exceeded by the current I during a write time interval can switch the direction of magnetization in the free layer 102 between parallel and antiparallel. In an array of a large number of MRAM cells, such as MRAM cell 100, the critical current level $I_C$ will be different for different MRAM cells in the array due to manufacturing process variations.

FIG. 1B illustrates at 120 the manufacturing process variations of the critical current level $I_C$ in an MRAM array. A horizontal axis 122 represents the element current I. A vertical axis 124 represents a statistical frequency of the critical current level $I_C$. A curve 126 represents the statistical frequency variation of the critical current level $I_C$ for the MRAM array. In order to write reliably to the MRAM array, the external electronic circuit provides a write current $I_W$ at 128 that is larger than the largest value of the critical current level $I_C$ at 126. In order to read reliably without accidental writing to the MRAM array, the external electronic circuit provides a read current $I_R$ at 130 that is less than the smallest value of the critical current level $I_C$ at 126.

FIG. 1C illustrates in a graph 140 the various levels of the element voltage V. A horizontal axis 142 represents the element voltage V. A vertical axis 144 represents a statistical frequency of a voltage level $V_L$. A curve 146 represents the statistical frequency variation of the voltage level $V_L$ for the MRAM array. Additional voltage levels $V_H$, $V_C$, $V_W$ and $V_{db}$ are also shown for reference in graph 140. The voltage V of the MRAM element 100 is at $V_L$ when a logical low (0) is read from MRAM element 100. The voltage V of the MRAM element 100 is at $V_H$ when a logical high (1) is read from MRAM element 100. The voltage V of the MRAM element 100 is at a mean value $V_W$ when a write current is applied to the MRAM element 100. A voltage level $V_{db}$ represents a dielectric breakdown voltage for the MRAM element 100.

FIG. 1D represents a design table that graphically illustrates design goals for various characteristics of the MRAM element 100. In FIG. 1D, an upwardly pointing arrow indicates a design goal of increasing a design quantity, while a downwardly pointing arrow indicates a design goal of reducing a design quantity.

As illustrated in FIG. 1D on the left, there is a design goal to decrease read current $I_R$. Decreasing $I_R$ provides more accidental write margin between $I_R$ and k (see graph 120) to avoid accidental writes, and also lowers power dissipation. There is also a design goal to increase ΔR, the resistance difference between reading a low (0) and a high (1) state of the MRAM element 100. Increasing ΔR improves signal-to-noise ratio (SNR) during a read operation. Increasing read current can also improve SNR, and thus there are design tradeoffs between improving SNR and increasing write margin.

As illustrated in FIG. 1D on the right, there is a design goal to increase dielectric breakdown voltage $V_{db}$ for the MRAM element 100. There is also a design goal to decrease the write current $I_W$ and also the critical current level $I_C$. Reducing the write current $I_W$ reduces power consumption, however, it has to be larger than the critical current $I_C$ by a sufficient margin to ensure reliable switching of all memory elements. It can be seen from FIG. 1D that there are design tradeoffs between the various design goals that are a function of the basic structure of the basic MRAM element 100 shown in FIG. 1A. These design tradeoffs can be summarized as (i) keep ΔR as high as possible to reduce Ir and (ii) keep $I_C$ distribution tight enough so that a lower end of this distribution is sufficiently above Ir and an upper end is sufficiently below $I_W$, which in turn should be kept well below $V_{db}$. The options for improving overall performance of the structure shown in FIG. 1A are limited by the structure. In structures disclosed in more detail below in FIGS. 3-9, a spin torque $\tau_w$ exerted by the current $I_W$ is increased by use of a modular magnetoresistive memory element that has a free layer that functions as a shared storage layer for read and write modules.

The limitations of the basic MRAM element 100 in FIG. 1A can be avoided, as described below, by using a spin transfer torque (STT) effect in a modular tunneling junction cell (STT-MRAM). In such a modular magnetoresistive memory element, two functions (i) a current driven switching (referred to as "$\tau_w$") function and (ii) a read back (referred to as "ΔR") function are performed by two or more elements disposed in series, with each of these elements being optimized to perform the "$\tau_w$" and "ΔR" functions. These elements disposed in series are coupled via a shared storage layer (SL) or free layer (FL). Within this concept, four embodiments are contemplated: 1.) Rτ<Rr; 2.) Rτ comparable to Rr and large; 3.) Rτ comparable to Rr and small; and 4.) RΔ>Rr. The first and fourth embodiments can correspond with combinations of GMR and TMR junctions sharing a free layer FL. The second embodiment can correspond with a combination of tunneling junctions optimized for different functions.

According to one aspect, providing a large ΔR (tunneling magnetoresistance) value satisfies a condition $\Delta V = V_H - V_L \gg I_R R * 6\sigma_R$, where $I_R$ is read current and $3\sigma_R$ is a distribution of resistance in high (H) and low resistance (L) states, and σ represents a statistical standard deviation. According to another aspect, a read current $I_R$ satisfies $I_R < I_C - 3\sigma_I$ where $\sigma_1$ is a standard deviation of a distribution of characteristic spin transfer torque (STT) switching currents and Ic is a mean value of the critical current level.

According to yet another aspect, a write current $I_w$ satisfies a condition $I_w > I_C + 3\sigma_I$ but write current $I_W$ kept low enough so that $V_W$ is below a dielectric breakdown voltage $V_{db}$.

FIG. 2A illustrates a graph of normalized spin torque $\tau_w/I_W$ as a function of bias voltage $V_B$ across a read module that comprises a tunneling magnetoresistor (structurally similar to layers 102, 104, 106 in FIG. 1A). A horizontal axis 202 represents the read module voltage $V_B$, and a vertical axis 204 represents the normalized spin torque $\tau_w/I_W$. A curve 206 represents the value of the normalized spin torque $\tau_w/I_W$ for a selected value of write voltage $V_W$.

Figure 2B:
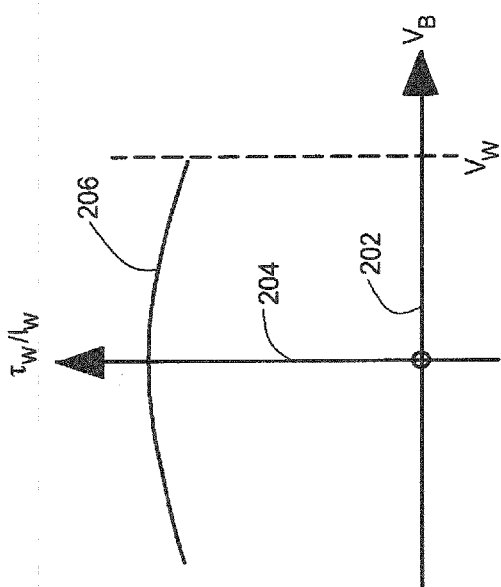
FIG. 2B illustrates a graph of magnetoresistance $\Delta R$ as a function of the bias voltage $V_B$.

FIG. 2B illustrates a graph of magnetoresistance ΔR as a function of the bias voltage $V_B$. A horizontal axis 222 represents the read module voltage $V_B$, and a vertical axis 224 represents the magnetoresistance ΔR. A curve 226 represents the value of the magnetoresistance ΔR for a selected value of read voltage $V_R$.

As illustrated by FIGS. 2A, 2B, the design goals are hard to satisfy at the same time and achieve optimum design with the structure of FIG. 1A. First, ΔR and Ic do not scale the same way with the size of STT-MRAM cell. Ic is linearly dependent on the magnetic anisotropy (thermal stability) of the element while ΔR remains practically constant. To increase density one has to increase Ic so much that relation $I_W R > V_{db}$ cannot be satisfied. These types of differences between torque ($\tau_w$) and resistive response (ΔR) manifest themselves in tests on tunnel junctions showing that normalized spin torque τw/$I_W$ as a function of $V_B$ (FIG. 2A) in tunneling junctions is relatively weakly dependent on the bias voltage $V_B$ function as compared to the magneto-resistance ΔR as a function of $V_B$ (FIG. 2B) that is a strong function of the bias voltage $V_B$.

Thus ΔR (resistive) and STT ($\tau_w$) optimum performances do not occur at the same set of parameters due to a difference in the physics of these two effects (STT and magneto-resistance) combined together in one STT-MRAM cell (FIG. 1A). This problem is solved by the use of a modular magnetoresistive element as described below in connection with FIG. 3.

Figure 3:
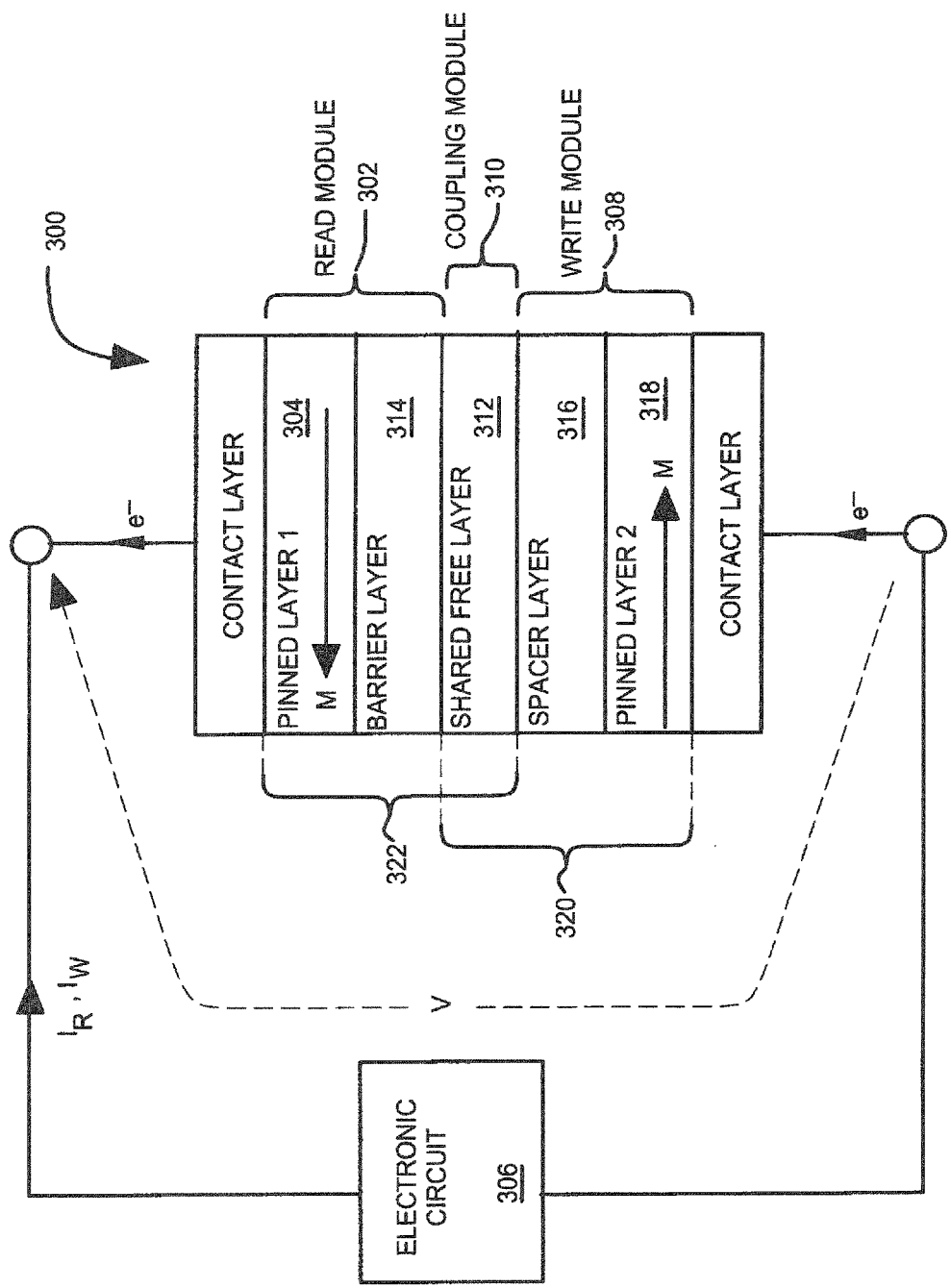
FIG. 3 illustrates a modular magnetoresistive memory element 300, also called a modular MRAM cell.

FIG. 3 illustrates a modular magnetoresistive memory element 300, also called a modular MRAM cell 300. The modular magnetoresistive memory element 300 comprises a read module 302. The read module 302 comprises a first pinned layer 304. The first pinned layer 304 has a magnetoresistance (ΔR) that is readable by application of a read current $I_R$ received from an electronic circuit 306.

The modular magnetoresistive memory element 300 comprises a write module 308. The write module 308 receives a write current $I_W$ from the external circuit 306.

The modular magnetoresistive memory element 300 comprises a coupling module 310. The coupling module 310 is adjacent both the write module 308 and the read module 302. The coupling module 310 comprises a free layer 312. The free layer 312 functions as a shared storage layer for both the read module 302 and the write module 308. The shared storage layer 312 has a spin that influences the magnetoresistance (ΔR) and that is rotatable by the write current $I_W$.

The write module 308 comprises a second pinned layer 318. Electrons polarized by the first pinned layer 304 exert a torque τ1 on the magnetization in the free layer 312. In addition, reflected electrons from second pinned layer 318 exert an additional torque τ2 on the magnetization in the free layer 312. The torques τ1 and τ2 add in the free layer 312 to increase a net torque on the free layer 312. The use of the two pinned layers 304, 318 permits separate optimization of the reading and writing processes by selecting differing materials, manufacturing processes, shapes or dimensions of each of pinned layers 304, 318. The problem with the design tradeoffs illustrated in FIG. 1D is relieved by the availability of separate optimization of read and write processes.

According to one aspect, the write module 308 is optimized as a giant magnetoresistive (GMR) stack 320 with high switching efficiency features such as low critical current and narrow statistical distribution of critical current. According to another aspect the read module 302 is optimized as a tunneling magnetoresistive (TMR) stack 322 with high resistance and large ΔR to provide high read sensitivity at low levels of read current $I_R$.

The resistance of the write module 308 contributes to the resistance of the element 300 and changes as the free layer 312 switches. However, the readback signal ($V_H$ or $V_L$) is dominated by the much larger ΔR of the read module 302. In addition, the writing process in the element 300 with two pinned layers 304, 318 is also affected by torques τ1 and τ2 from the pinned layers 304, 318. However, since the pinned layers 304, 318 are magnetized oppositely, their torques τ1 and τ2 constructively, and so the switching of the free layer 312 is more efficient than switching in a conventional cell design with only one free layer such as shown in FIG. 1A.

According to one aspect, the write module 308 performs a write function by spin transfer torque switching using a spin polarized write current. According to another aspect, the spin transfer torque switching comprises rotation of magnetization of the free layer 312. According to yet another aspect, the spin transfer torque switching comprises domain wall nucleation.

According to one aspect the read module 302 comprises a barrier layer 314. According to another aspect the barrier layer 314 comprises a non-conductive oxide material such as MgO, $AlO_X$ or other known non-conductive oxide material suitable for use as a barrier layer.

According to one aspect, the write module 308 comprises a spacer layer 316. According to another aspect, the spacer layer 316 comprises a non-magnetic metal such as Cu, Pt, Ru or other known non-magnetic material suitable for use as a spacer layer.

Figure 4:
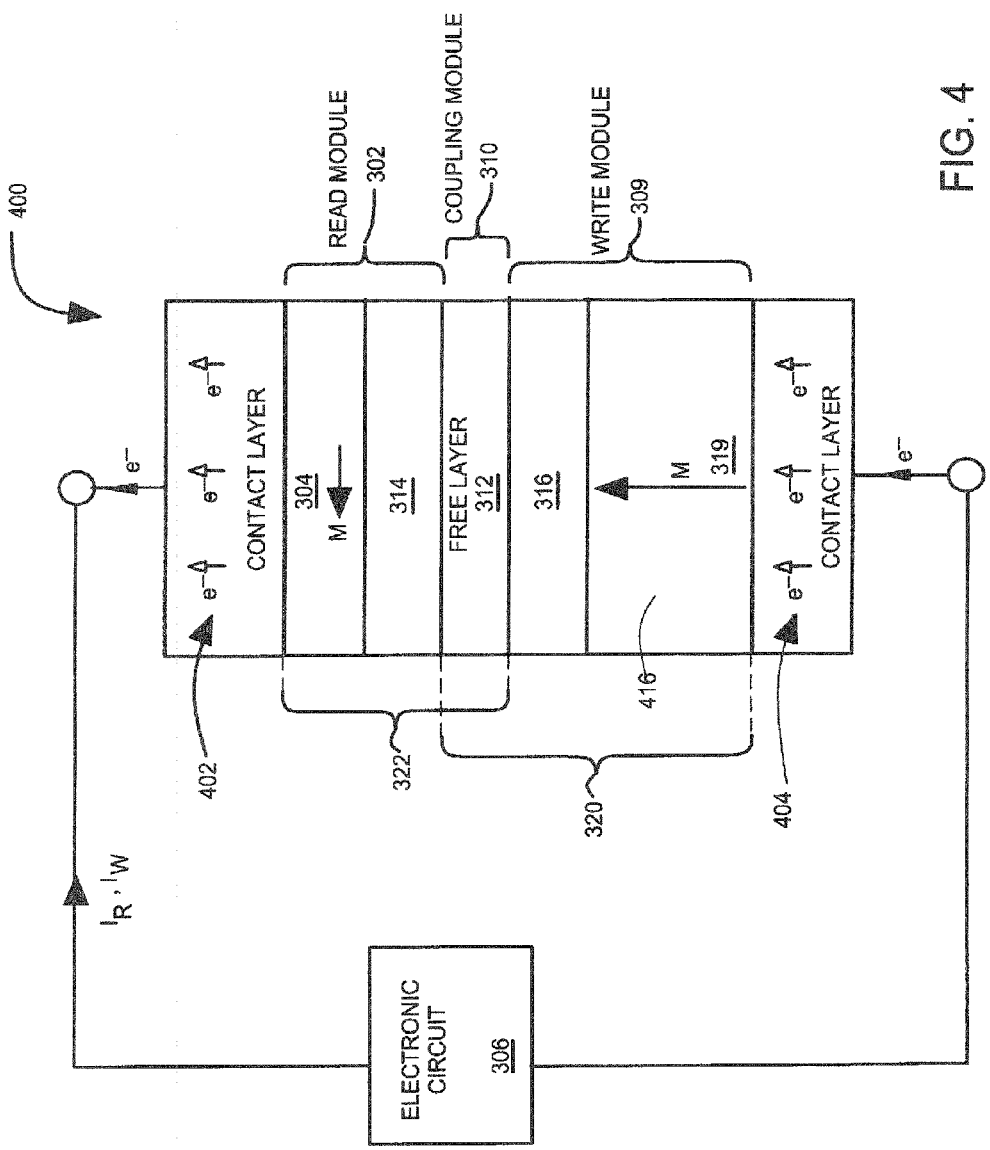
FIG. 4 illustrates a modular magnetoresistive memory element 400 that includes a pinned layer that is magnetized perpendicular to the plane.

FIG. 4 illustrates a modular magnetoresistive memory element 400. Element 400 in FIG. 4 is similar to element 300 in FIG. 3 except that the element 400 has a write module 309 that includes a second pinned layer 319 that is magnetized perpendicular to the plane, while the write module 308 in FIG. 3 includes a second pinned layer 318 that is magnetized parallel to plane. Reference numbers shown in FIG. 4 that are the same as reference numbers shown in FIG. 3 identify the same otherwise similar features.

According to one aspect, the pinned layers 304, 319 comprise either magnetically non-collinear or magnetically collinear pinned layers. According to one example, layers 322 can comprise a TMR stack 322 (with a pinned layer 304 having magnetoresistance ΔR); and layers 320 can comprise a GMR stack 320 (with a pinned layer 319) can have either collinear or non-collinear magnetization. The selection of collinear or non-collinear magnetization can be made to provide an optimum combination of magnetoresistance ΔR and performance of the GMR stack 320. In FIG. 4, the two spin polarized torques τ1 and τ2 combine to increase total torque. The increased total torque reduces the critical current needed to switch magnetization of the storage layer 312.

According to one aspect in FIG. 4, the second pinned layer 319 has an anisotropy axis perpendicular to a major plane of the second pinned layer 319 such that the magnetization of the second pinned layer 319 and the free layer 312 are in equilibrium and perpendicular to each other. There is no resistance change in the write module 309 (FIG. 4), when the magnetization of the free layer 312 switches direction. On the one hand, the aspect shown in FIG. 4 eliminates any influence of changes to resistance of the write module 309 during readback. On the other hand, the aspect shown on FIG. 4 is significantly more efficient in switching the free layer 312 with smaller critical currents since the second pinned layer 319 always generates a strong torque τ2 on the free layer 312. As a result, while the writing process is controlled with pulsed currents, the interaction of the free layer 312 with the second pinned layer 319 is assisting in the writing process.

Figure 5:
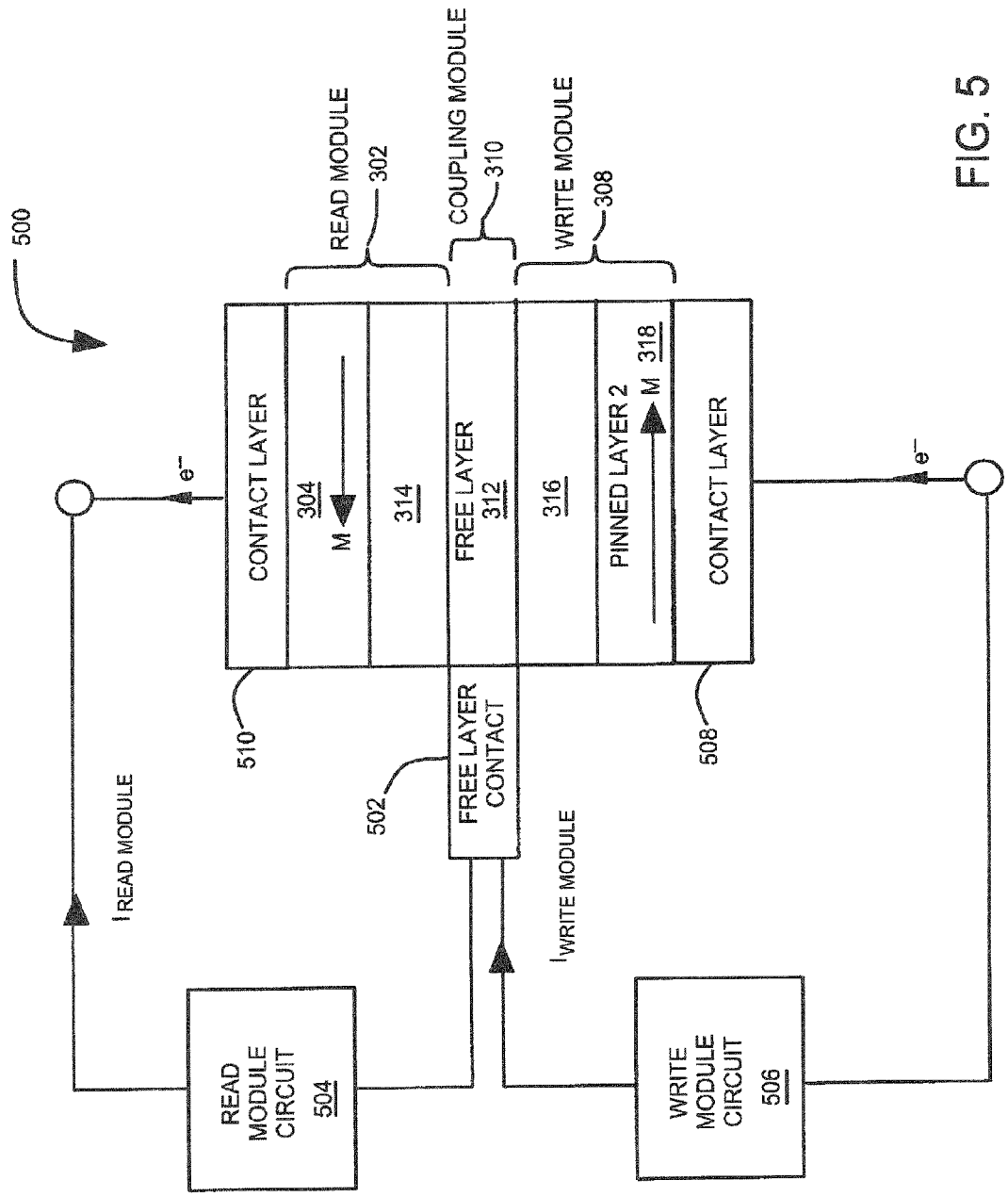
FIG. 5 illustrates a modular magnetoresistive memory element that includes a free layer contact.

FIG. 5 illustrates a modular magnetoresistive memory element 500. Element 500 in FIG. 5 is similar to element 300 in FIG. 3, except that the element 500 includes a free layer contact 502 that contacts the free layer 312 and the free layer contact 502 is not included in FIG. 3. Reference numbers shown in FIG. 5 that are the same as reference numbers shown in FIG. 3 identify the same or similar features.

The contact 502 is directly attached to the free layer 312. A write module electronic circuit 506 is coupled to the free layer contact 502 and a bottom contact layer 508 and provides a write module current $I_{WRITE\ MODULE}$ to the write module 308. A read module electronic circuit 504 is coupled to the free layer contact 502 and a top contact layer 510 and provides a read module current $I_{READ\ MODULE}$ to the read module 302. The write module current $I_{WRITE\ MODULE}$ and the read module current $I_{READ\ MODULE}$ are separately controllable by circuits 504, 506 during both read and write operations to provide an optimum combination of currents for each operation.

In FIG. 5, a writing process occurs by sending a current through the write module 308 between contacts 508 and 502. The read module circuit 504 need not participate in this write process since no read module current needs to flow through contact 510 during a write process. On the other hand, the reading process bypasses the write module and electrons flow from contact 502 to contact 510 through the read module 302.

Figure 6:
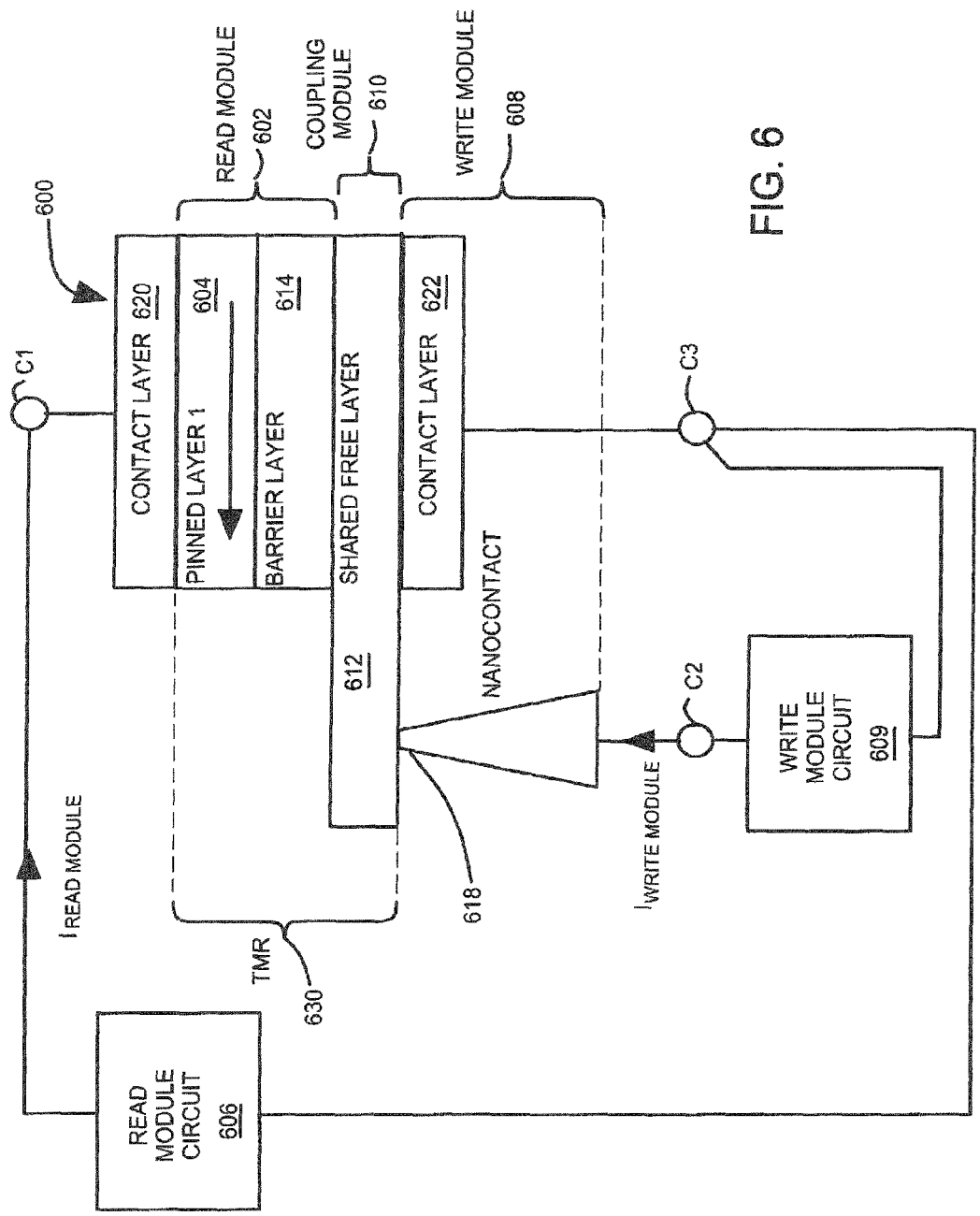
FIG. 6 illustrates a modular magnetoresistive memory element that includes a nano-contact.

FIG. 6 illustrates a modular magnetoresistive memory element 600, also called a modular MRAM cell 600. The modular magnetoresistive memory element 600 comprises a read module 602. The read module 602 comprises a first pinned layer 604. The first pinned layer 604 has a magnetoresistance (ΔR) that is readable by application of a read current $I_R$ received from a read module electronic circuit 606.

The modular magnetoresistive memory element 600 comprises a write module 608. The write module 608 receives a write current $I_W$ from a write module electronic circuit 609.

The modular magnetoresistive memory element 600 comprises a coupling module 610. The coupling module 610 is adjacent both the write module 608 and the read module 602. The coupling module 610 comprises a free layer 612. The free layer 612 functions as a shared storage layer for both the read module 602 and the write module 608. The shared storage layer 612 has a spin that influences the magnetoresistance (ΔR) and that is rotatable by the write current $I_W$.

The write module 608 comprises a nano-contact 618. Electrons polarized by the first pinned layer 604 exert a torque τ1 on the magnetization in the free layer 612. The element 600 is contacted by three contacts, the nano-contact 618, a top contact 620 and a bottom contact 622. The use of the three contacts 618 (C2), 620 (C1), 622 (C3) permits separate optimization of the reading and writing processes by providing two different current levels to the contacts. The problem with the design tradeoffs illustrated in FIG. 1D is relieved by the availability of separate optimization of read and write module currents.

According to one aspect, the read module 602 is optimized as a tunneling magnetoresistive stack 630 with high resistance and large ΔR to provide high read sensitivity at low levels of read module current $I_{READ\ MODULE}$.

The nanocontact 618 utilizes a process of point contact domain wall (DW) nucleation with high density currents in the free layer 612. The small cross sectional area of the nanocontact 618 results in high current density at the point of contact with the free layer. Due to the high current density, domain wall nucleation can take place at low write current levels. The use of a point contact on extended free layer 612 simplifies the design of the free layer 612 (which can be considerably bigger than the remaining TMR stack 630 and is therefore a less critical process). Contacting the element 600 with contacts C2 and C3 becomes considerably easier with an extended free layer 612 as illustrated.

Writing of data in the free layer 612 occurs through contact C2 and C3 where the spin torque effect at the nanocontact 618 induces switching in the free layer 612 and therefore stores the desired bit information in the free layer 612. Readback occurs through the TMR stack 630 through contacts C1 and C3, which bypasses the nanocontact C2. The reading and writing process are decoupled and the read and write currents and layer designs can be optimized for these two processes.

FIG. 7A illustrates a modular magnetoresistive memory element 700, also called a modular MRAM cell 700. The element 700 is similar to element 300 in FIG. 3, however, in element 700, a free layer 712 includes patterning which provides for domain wall nucleation and for storage of 2 bits of information. The two bits of information provide for 4 combinations or logical states (e.g., 00, 01, 10, 11) of stored data. FIG. 7B illustrates the patterning of the free layer 712 along a cross-section line 7B-7B in FIG. 7A.

In FIG. 7A, the free layer 712 comprises two separated, non equal portions A and B. The portions A and B switch at a significantly different write current density levels. Free layer portion A is separated from free layer portion B by an intervening layer 704 formed of non-magnetic material. Free layer portion A includes a defect 702 in the form of a notch that serves as a domain nucleation site that changes the current density level for switching free layer portion A. From a fabrication standpoint, pinning lines can be fabricated by introducing lines of defects.

Figure 8B:
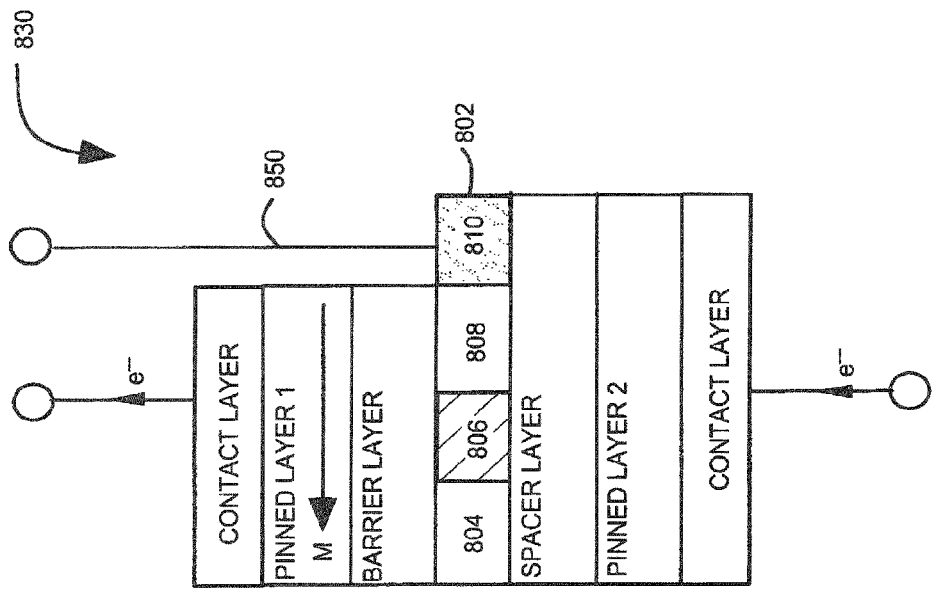
Figure 8A:
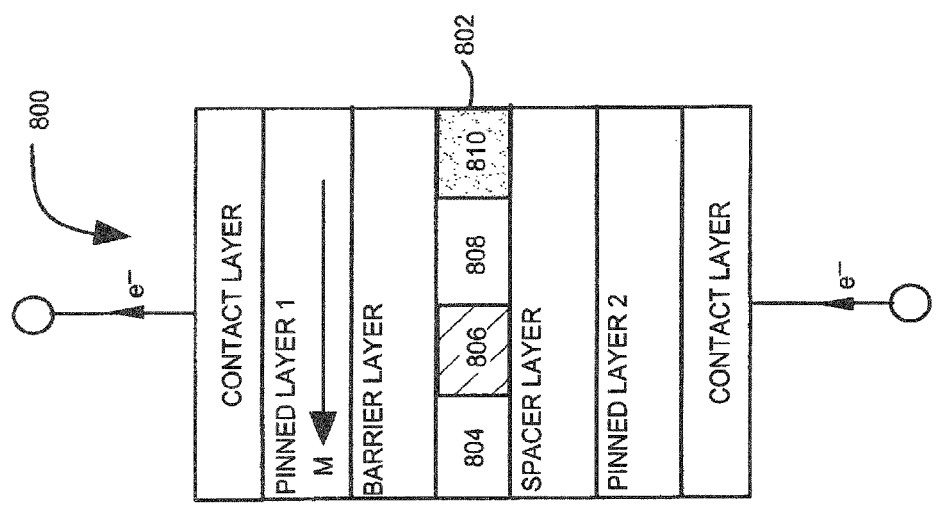

FIG. 8A illustrates a modular magnetoresistive memory element 800, also called a modular MRAM cell 800. The element 800 is similar to element 300 in FIG. 3, however, in element 800, a free layer 802 includes patterning which provides for storage of 2 bits of information. The free layer 802 comprises a first free layer portion 804 and a second free layer portion 808. The first free layer portion 804 is separated from the second free layer portion 808 by a band of non-magnetic material 806 that provides for domain wall nucleation. The free layer portion 808 is adjacent a band of material 810 that comprises magnetic material that enhances pinning.

FIG. 8B illustrates a modular magnetoresistive memory element 830, also called a modular MRAM cell 830. The element 830 is similar to element 800 in FIG. 8, however, in element 830, third contact 850 is provided in order to have different levels of current through the read module and write module.

Figure 9:
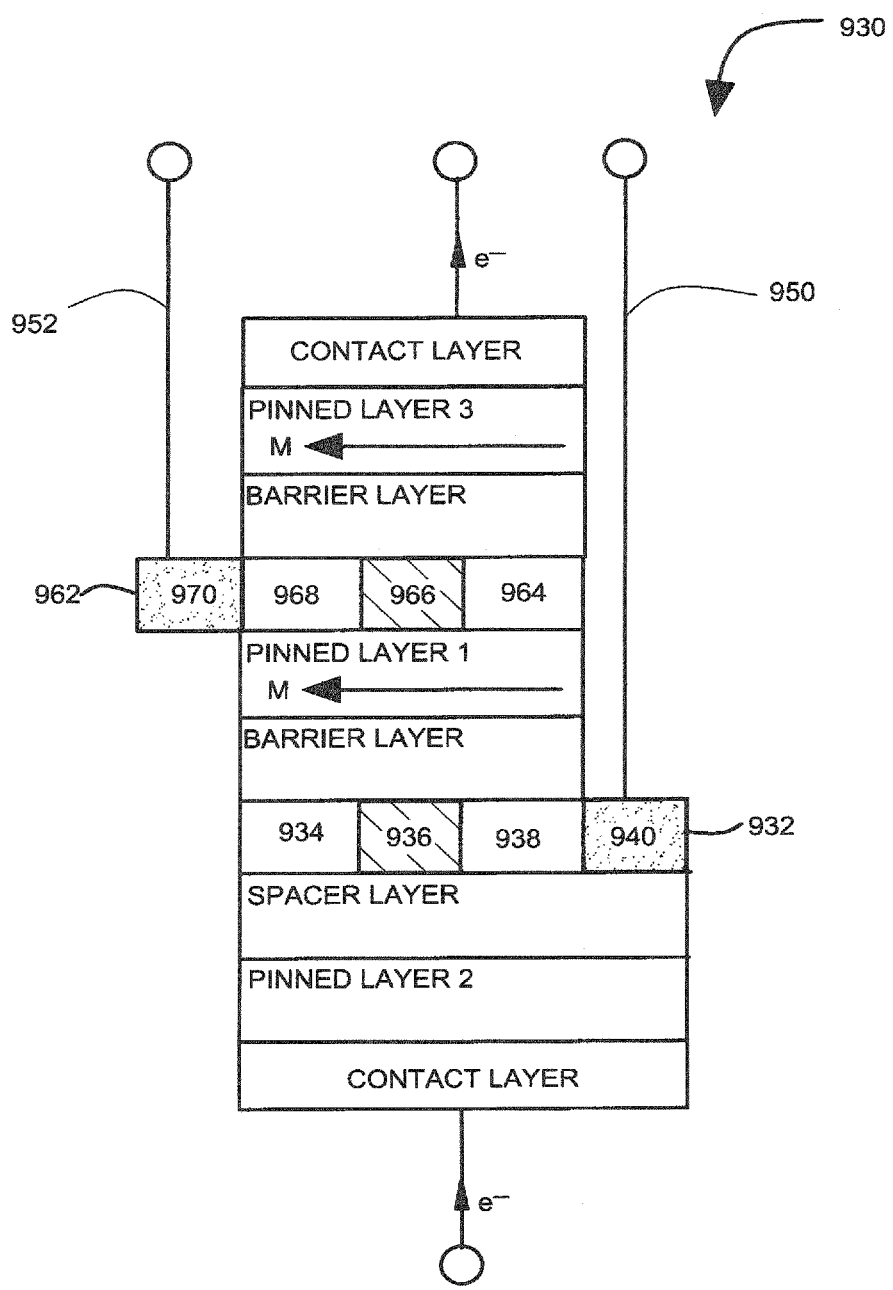
FIG. 9 illustrates a modular magnetoresistive memory element that includes two patterned free layers for storage of four bits of information.

FIG. 9 illustrates a modular magnetoresistive memory element 930, also called a modular MRAM cell 930. The element 930 is similar to element 830 in FIG. 8B, however, element 930 includes two free layers 932 and 962 that are stacked vertically in FIG. 9 and element 930 provides storage of 4 bits of data, in other words, 16 combinations of bits or 16 logic levels. The free layers 932, 962 each comprises a first free layer portion 934 or 964 and a second free layer portion 938 or 968. The first free layer portions 934, 964 are separated from the second free layer portions 938, 968 by bands of non-magnetic material 936, 966 that provides for domain wall nucleation. The free layer portions 938, 968 are adjacent band of material 940, 970 that comprises magnetic material that enhances pinning and that serve as contacts. Individual free layer connections 950, 954 are provided so that each layer can be separately addressed for reading or writing.

Figure 10A:
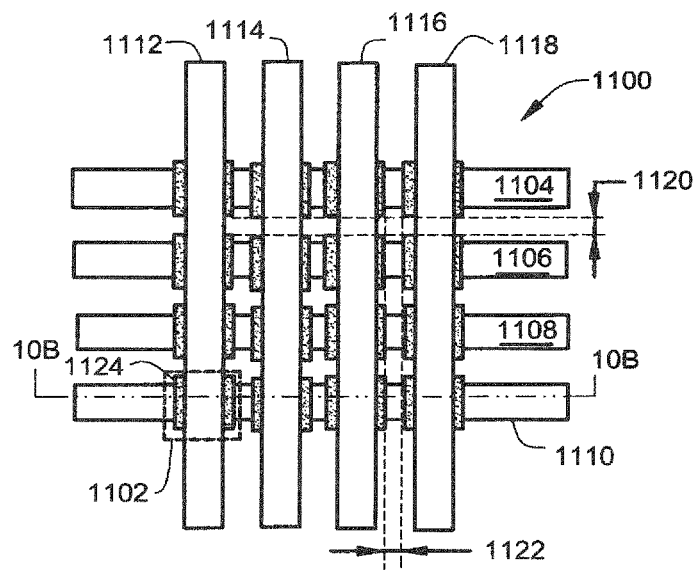
FIGS. 10A, 10B illustrate a memory array.
Figure 10B:
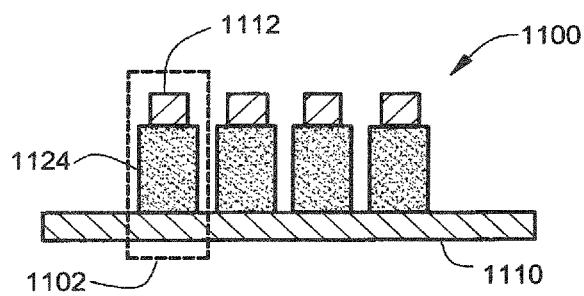

FIGS. 10A, 10B illustrate aspects of a memory array 1100. The memory array 1100 comprises an array of memory elements such as representative memory element 1124. FIG. 10A illustrates a top view of the memory array 1100. FIG. 10B illustrates a front cross-sectional view (along section line 10B-10B in FIG. 10A) of the memory array 1100.

Each memory element 1124 comprises a modular magnetoresistive memory element such as memory element 300 in FIG. 3, for example. Each memory element, such as representative memory element 1124, is at a location 1102 in the array where it is selectively addressable for reading and writing. The memory element 1124 stores one or more bits of data.

It is understood that the array of the memory elements 1100, while illustrated with 4 rows, 4 columns and 16 memory elements, typically includes a much larger number of rows, columns and memory elements. It is understood that the memory element at location 1102 is representative of all of the memory elements in the memory array 1100. Descriptions of features at the location 1102 also apply to other memory elements in the array of memory cells 1100.

In FIG. 10A, conductors 1104, 1106, 1110, 1110 are arranged in rows on one side of the array 1100. Conductors 1112, 1114, 1116, 1118 are arranged in columns on a second opposite side of the array 1100. The array 1100 comprises a rectangular array of memory elements in rows and columns. The memory elements in the memory array 1100 are separated from one another by row spaces and column spaces (such as a row space 1120 and a column space 1122). In one aspect, row spaces and column spaces are filled with electrical insulation material (not illustrated) such as alumina. The row spaces and column spaces are sufficiently wide to provide adequate electrical isolation between the memory elements in the array 1100.

The memory element 1124 at location 1102 can be addressed for reading and writing through the conductors 1110, 1112 that cross at the location 1102. The location 1102 is selected (addressed) for read or write access by the use of solid state switches (not illustrated in FIGS. 10A-10B) to select the row and column conductors 1110, 1112 that cross in the cell 1102. When the memory element 1124 is accessed, electrical current and voltage is applied to the memory element 1124 between the conductors 1110, 1112.

While the array 1100 is illustrated with a single set of row conductors and a single set of column conductors, it will be understood that additional sets of row and column conductors can be provided for addressing a location in an array of memory devices. Two, three, four or more sets of conductors can be used for addressing.

It is to be understood that even though numerous characteristics and advantages of various aspects have been set forth in the foregoing description, together with details of the structure and function, this disclosure is illustrative only, and changes may be made in detail, especially in matters of structure and arrangement to the full extent indicated by the broad general meaning of the terms in which the appended claims are expressed.

What is claimed:

1. A magnetoresistive memory, comprising:
   a memory space having a programmable free layer;
   a read module having a first pinned layer and a write module having a second pinned layer, both modules in communication with the memory space;
   a write module circuit directly coupled to the memory space via a first electrically conductive contact and to the write module via a second electrically conductive contact and that operably imparts a write current at a first selected magnitude that passes through the first and second electrically conductive contacts to write data to the free layer; and
   a read module circuit directly coupled to the memory space via the first electrically conductive contact and to the read module via a third electrically conductive contact and that operably imparts a read current at a second selected magnitude different than the first selected magnitude that passes through the second and third electrically conductive contacts to read data from the free layer.

2. The magnetoresistive memory of claim 1 wherein the free layer has a discontinuous free layer defining multiple free layer portions that discretely store multiple sets of data.

3. The magnetoresistive memory of claim 2 wherein the read module has multiple read layers corresponding to the multiple free layer portions.

4. The magnetoresistive memory of claim 1 wherein the first electrically conductive contact has a nanocontact.

5. The magnetoresistive memory of claim 1 wherein the free layer has a domain wall nucleation site.

6. The magnetoresistive memory of claim 1 wherein the first pinned layer defines a magnetoresistance that is operably readable by a read current from the read module.

7. The magnetoresistive memory of claim 1 wherein the free layer operably receives spin torques from both the read module and the write module.

8. The magnetoresistive memory of claim 4 wherein the free layer defines a magnetization that is rotatable by the write current.

9. The magnetoresistive memory of claim 8 wherein the magnetization of the free layer operably switches direction at a critical current level.

10. The magnetoresistive memory of claim 9 wherein the critical level operably varies for different addressable storage locations.

11. The magnetoresistive memory of claim 10 wherein the nanocontact operably provides a spin torque that decreases the critical current level.

12. A method comprising:
    obtaining a magnetoresistive memory having a memory space, a read module and a write module both in communication with the memory space, a write module circuit coupled to the memory space and to the write module that bypasses the read module, and a read module circuit coupled to the memory space and to the read module that bypasses the write module;
    energizing the write module with a write current having a first amperage to write data to the memory space; and
    energizing the read module with a read current having a second amperage different than the first amperage to read data from the memory space.

13. The method of claim 12, wherein the read module has a read module pinned layer, a programmed state of the free layer determined responsive to a magnetoresistance established by the read module pinned layer and the read current.

14. The method of claim 12, wherein the write module has a write module pinned layer, a programmed state of the free layer determined responsive to the write module pinned layer and the write current.

15. The method of claim 12, wherein the free layer has a discontinuous free layer having multiple free layer portions each individually programmable to different storage states by respective write currents.

16. A storage device comprising:
    an array of magnetoresistive memory cells, each cell having a discontinuous free layer defining multiple free layer portions configured to discretely store multiple sets of data, a read module coupled to a first surface of the free layer, and a write module coupled to an opposing second surface of the free layer;
    a read module circuit directly coupled to the read module of a selected cell via a first contact and to the write module via a second contact, the free layer between the first and second contacts; and
    a write module circuit directly coupled to the write module of the selected cell via the second contact and to the free layer via a third contact.

17. The magnetoresistive memory of claim 16 wherein the pinned layer has a first pinned layer and the write module has a second pinned layer.

* * * * *